(12) United States Patent
Lee et al.

(10) Patent No.: US 11,282,988 B2
(45) Date of Patent: Mar. 22, 2022

(54) LIGHT-EMITTING DEVICE AND METHOD OF FORMING THE SAME

(71) Applicants: TAIWAN APPLIED CRYSTAL CO., LTD., Kaohsiung (TW); NATIONAL SUN YAT-SEN UNIVERSITY, Kaohsiung (TW)

(72) Inventors: Tsung-Xian Lee, Taoyuan (TW); Chu-An Lee, Kaohsiung (TW); Wei-Chang Lin, Kaohsiung (TW); Ming-Chi Chou, Kaohsiung (TW)

(73) Assignees: TAIWAN APPLIED CRYSTAL CO., LTD., Kaohsiung (TW); NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 16/940,361

(22) Filed: Jul. 27, 2020

(65) Prior Publication Data
US 2021/0036191 A1 Feb. 4, 2021

(30) Foreign Application Priority Data
Jul. 31, 2019 (TW) ................. 108127263

(51) Int. Cl.
*H01L 33/50* (2010.01)
*H01L 33/10* (2010.01)
*H01L 33/26* (2010.01)

(52) U.S. Cl.
CPC ............ *H01L 33/502* (2013.01); *H01L 33/10* (2013.01); *H01L 33/26* (2013.01)

(58) Field of Classification Search
CPC ........ H01L 33/502; H01L 33/10; H01L 33/26
See application file for complete search history.

(56) References Cited

U.S. PATENT DOCUMENTS

| 9,537,060 B2* | 1/2017 | Yoon ...................... H01L 33/504 |
| 9,735,323 B2* | 8/2017 | Asai ......................... H05B 33/14 |
| 10,270,014 B2* | 4/2019 | Park ....................... H01L 33/508 |
| 2009/0224177 A1* | 9/2009 | Kinomoto .......... C09K 11/7789 250/484.4 |
| 2012/0032219 A1* | 2/2012 | Ooyabu ................. B82Y 30/00 257/98 |
| 2012/0306356 A1* | 12/2012 | Yoon .................. C09K 11/7734 313/503 |
| 2017/0033267 A1* | 2/2017 | Tamaki ................. H01L 33/508 |

FOREIGN PATENT DOCUMENTS

| CN | 1815765 A | 8/2006 |
| CN | 102384383 A | 3/2012 |
| CN | 105189698 A | 12/2015 |
| CN | 105658764 A | 6/2016 |
| CN | 106449948 A | 2/2017 |
| CN | 107154454 A | 9/2017 |
| CN | 108023004 A | 5/2018 |
| CN | 110911538 A | 3/2020 |

* cited by examiner

*Primary Examiner* — Mark W Tornow
(74) *Attorney, Agent, or Firm* — CKC & Partners Co., LLC

(57) ABSTRACT

A light-emitting device includes a composite structure having a phosphor crystal sheet and phosphor crystal powders on the phosphor crystal sheet. A light-emitting unit of the device is disposed under a side of the phosphor crystal sheet that is opposite to a side of the phosphor crystal powders. A problem of blue-enriched white light may be tackled.

10 Claims, 8 Drawing Sheets

LIGHT-EMITTING DEVICE AND METHOD OF FORMING THE SAME

CROSS-REFERENCE TO RELATED APPLICATION

This application claims priority to Taiwan Application Serial Number 108127263 filed Jul. 31, 2019, which is herein incorporated by reference in its entirety.

BACKGROUND

Field of Invention

The present invention relates to a light-emitting source and a method of producing the same. More particularly, the present invention relates to an application of a composite structure of a phosphor crystal sheet and phosphor crystal powders formed by a phosphor crystal, so as to tackle a problem of blue-enriched white light.

Description of Related Art

In a common light-emitting device, a light-emitting diode emits blue light, such that a portion of the blue light enters a fluorescent-powder layer to generate yellow light or green light, and the other portion of the blue light penetrates the fluorescent-powder layer. When the yellow light and the blue light are mixed, white light can be generated. Heat is generated during a light-emitting process, and the heat may easily cause negative effects such as reduction in light emission efficiency, blue-enriched white light, or overheat of the device.

A known method to tackle the above problems is to additionally configure a heat sink on the fluorescent powder layer. However, brightness of the light-emitting device may be insufficient. With the development of the technology, the fluorescent powder layer is replaced by phosphor crystal. The phosphor crystal has satisfactory property of heat dissipation, and it may have a single crystal structure. In addition to improvement on the unsatisfactory property of the heat dissipation, the phosphor crystal also has merits such as stable energy level transition and high light conversion rate. However, a path that the blue light travels through the phosphor crystal is shorter than a path that the blue light travels through the fluorescent powder layer, resulting in less blue light that can be absorbed. That is, the blue light has high light transmission rate, and thus the defect of blue-enriched white light cannot be tackled. If a thickness of the phosphor crystal increases to increase a length the travelling path of the light, the phosphor crystal will be not compatible with the specification of the common light-emitting device. Furthermore, cost of producing the light-emitting device may significantly increase because of high cost for growing the phosphor crystal.

Accordingly, a light-emitting device and a method of producing the same are required to improve the defect of blue-enriched white light. Such device may have satisfactory properties of heat dissipation, light conversion efficiency and light emission rate. Besides, the light-emitting device is compatible with the specification of the common light-emitting device, so that a cost of producing such device can be reduced.

SUMMARY

An aspect of the present invention is to provide a light-emitting device which includes a first phosphor layer, a second phosphor layer and a light source. The first phosphor layer is composed of a phosphor crystal sheet and has a first surface and a second surface opposite to the first surface. The second phosphor layer is disposed on the second surface of the first phosphor layer. The second phosphor layer is composed of plural first phosphor crystal powders, each of the first phosphor crystal powders has a crystal orientation, and the first phosphor crystal powders are sintered to be connected to each other, and at least a portion of the first phosphor crystal powders is sintered to be connected to the second surface of the first phosphor layer. The light source is disposed near a side of the first surface of the first phosphor layer, or near a side of the second phosphor layer.

In accordance with some embodiments of the present invention, the phosphor crystal sheet has a single crystal structure or a poly crystal structure, and the first phosphor crystal powders have a single crystal structure or a poly crystal structure.

In accordance with some embodiments of the present invention, the light-emitting device further includes a third phosphor layer disposed on the first surface of the first phosphor layer. The third phosphor layer is composed of a plurality of second phosphor crystal powders, and each of the second phosphor crystal powders has a crystal orientation.

In accordance with some embodiments of the present invention, the first phosphor crystal powders having the poly crystal structure is doped with a rare-earth element, and a doping concentration of the rare-earth element is at least 0.1 at. %.

In accordance with some embodiments of the present invention, a first emitting light of the light source has a first light-emitting wavelength, the first phosphor layer absorbs the first emitting light and emits a second emitting light having a second light-emitting wavelength, and the second phosphor layer absorbs the first emitting light and emits a third emitting light having a third light-emitting wavelength. The second light-emitting wavelength is smaller than or equal to the third light-emitting wavelength.

In accordance with some embodiments of the present invention, the phosphor crystal sheet having the single crystal structure is doped with a rare-earth element, and the rare-earth element has a doping concentration equal to or smaller than 6 at. %.

In accordance with some embodiments of the present invention, a ratio of a thickness of the first phosphor layer to a thickness of the second phosphor layer is in a range from 1:1 to 14:1.

In accordance with some embodiments of the present invention, the light source is disposed on the side of the second phosphor layer, and the light-emitting device further includes a reflecting layer disposed on the first surface of the first phosphor layer.

In accordance with some embodiments of the present invention, the light source is disposed on the side of the second phosphor layer, and the light-emitting device further includes a reflecting unit disposed between the second phosphor layer and the light source.

In accordance with some embodiments of the present invention, the light-emitting device further includes a substrate and a package layer. The light source is disposed on the substrate. The package layer wraps around the light-source and is disposed on the substrate, in which the first phosphor layer is disposed on the package layer via the first surface.

The other aspect of the present invention provides a method of producing a light-emitting device. First, a first phosphor is provided. The first phosphor layer is a phosphor crystal sheet formed by cutting a first phosphor crystal bar. Then, plural phosphor crystal powders are distributed on the first phosphor layer. The phosphor crystal powders are formed by pulverizing a second phosphor crystal bar. Next, the first phosphor layer and the phosphor crystal powders are sintered, such that the phosphor crystal powders are sintered to be connected to each other and to the first phosphor layer.

In accordance with some embodiments of the present invention, sintering the first phosphor layer and the phosphor crystal powders is performed at a temperature in a range from 1600° C. and a melting point of the phosphor crystal powders.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
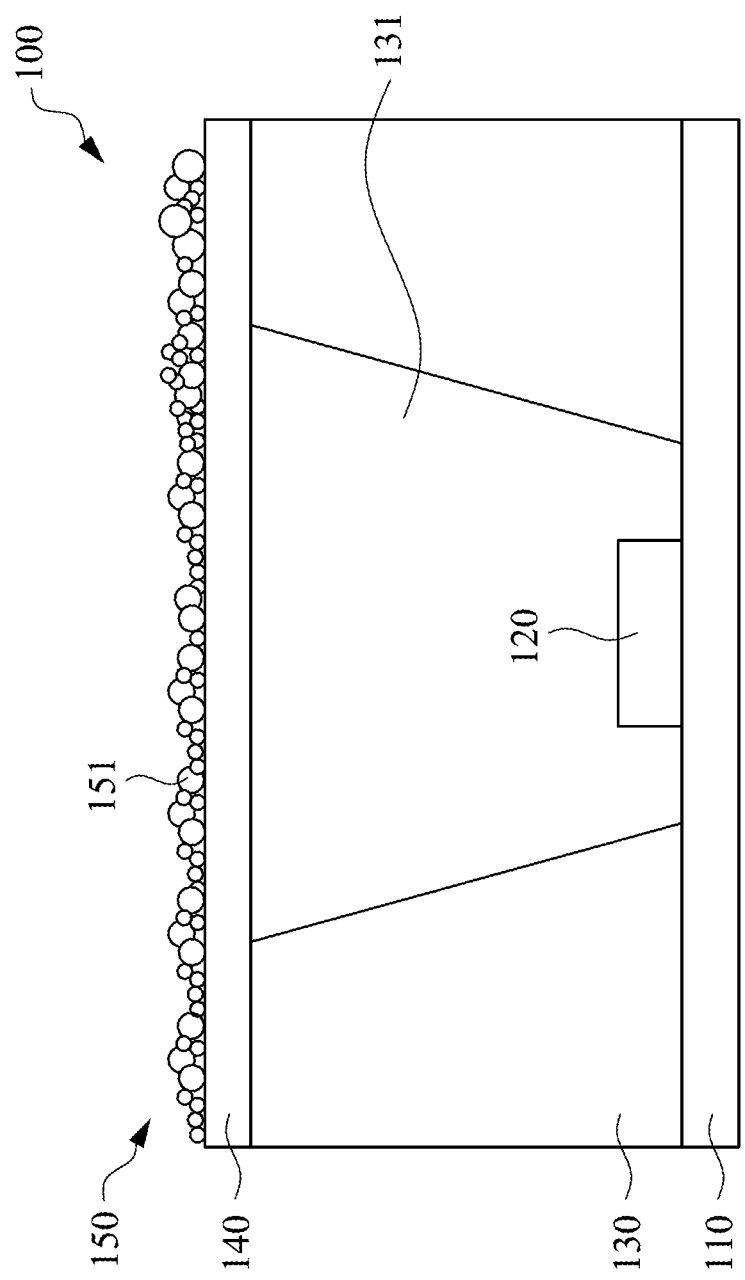
FIG. 1 is a cross-sectional view showing a light-emitting device in accordance with some embodiments of the present invention.

One aspect of the present invention provides a light-emitting device and a method of producing the same. In some embodiments, the light-emitting device, which is compatible with the specification of the common light-emitting device, has a composite structure including a phosphor crystal sheet layer and a phosphor crystal powder layer thereon. The phosphor crystal powder layer has a crystal orientation (i.e., has a single crystal structure or a poly crystal structure). Such composite structure allows light of a light-emitting unit travelling through the phosphor crystal powder layer after it travels through the phosphor crystal sheet layer, so that a length of a light path increases, and the light has not been absorbed and converted in the phosphor crystal sheet layer may be converted into light having a desired wavelength by the phosphor crystal powder layer. Therefore, less light of the light-emitting unit penetrates the composite structure, thereby tackling the problem of the blue-enriched white light. Alternatively, the light may travel through the phosphor crystal powder layer first, and then it travels through the phosphor crystal sheet layer. In other embodiments, the phosphor crystal powder layer may have a doping concentration of a rare-earth element that is different from a doping concentration of the rare-earth element of the phosphor crystal sheet layer, so that light having various chromaticity may be generated. Accordingly, the phosphor crystal powder layer is regarded as a compensation layer, which compensates for the insufficient length of the light path or chromaticity (i.e., the wavelength of the light) of the emitting light generated by the phosphor crystal sheet layer. As a result, a rate (or percentage) that the light of the light-emitting unit directly penetrating through the composite structure decreases, or flexibility for adjusting the chromaticity of the light-emitting device increases based on said chromaticity compensation method. The light-emitting device of the present invention has a satisfactory light conversion rate (or wavelength conversion rate), light emission efficiency and a flexible chromaticity-adjusting property. In addition, the phosphor crystal material has satisfactory property for heat dissipation, and thus the light-emitting device of the present invention also has the satisfactory property of heat dissipation, such that a light source (e.g., a laser) which generates heat easily and causes high temperature can be applied to the light-emitting device of the present invention.

The light conversion rate is referred to an external light-conversion rate. An internal light-conversion rate represents a percentage that the light having a short wavelength absorbed by the phosphor is converted into the light having a long wavelength. This is detected by an optics integrating sphere and calculated by the following formula (1). The external light-conversion rate is then calculated by using the internal light-conversion rate and the following formula (2).

Internal light-conversion rate=an emitting amount of light having a long wavelength/an emitting amount of light having a short wavelength  (1)

External light-conversion rate=light extraction coefficient×internal light-conversion rate  (2)

The light emission efficiency is positively related to the external light-conversion rate. In addition, in a preferable embodiment, the light emission efficiency is at least 150 lumens/watt.

Please refer to FIG. 1. FIG. 1 is a schematic sectional view showing a light-emitting device in accordance with some embodiments of the present invention. In some embodiments, a light-emitting device 100 includes a substrate 110, a light-emitting unit 120, a package layer 130, a first phosphor layer 140 and a second phosphor layer 150. The light-emitting unit 120 is disposed on the substrate 110, and the package layer 130 covers the light-emitting unit 120 and disposed on the substrate 110. The first phosphor layer 140 is disposed on a side opposite to the package layer 130 of the substrate 110, and the second phosphor layer 150 is disposed on the first phosphor layer 140.

The substrate 110 may be formed of a material having satisfactory thermal conductivity. Specifically, the material for forming the substrate 110 may include but is not limited to, a metal substrate formed of aluminum or copper, or a ceramic substrate.

The light-emitting unit 120 may be, for example, a light-emitting diode, a laser diode, or the like. In some embodiments, emitting light of the light-emitting unit 120 may be blue light having a wavelength of 380 nm to 490 nm. In certain embodiments, a flip chip element of a semiconductor compound such as gallium nitride may be used as the light-emitting unit 120 to emit the blue light having such range of the wavelength. In other embodiments, the emitting light of the light-emitting unit 120 may be light having different short-wavelength.

The package layer 130 may be formed of an opaque resin. For example, the resin may be a white resin. An opening 131 is formed in the package layer 130, and a width of the opening increases along a direction from the substrate 110 to the first phosphor layer 140. The light-emitting unit 120 is disposed in the opening 131.

A material of the first phosphor layer 140 and the second phosphor layer 150 may include but is not limited to a phosphor of a garnet crystal structure (e.g., Re:$Y_xAl_yO_z$, in which Re represents an rare-earth element, and x, y, and z respectively represent a number greater than 0), a silicate-based phosphor crystal, an oxide-based phosphor crystal, an aluminate-based phosphor crystal and the like, an oxynitride-based phosphor crystal, a sulfide-based phosphor crystal, a nitride-based phosphor crystal and the like, and these phosphor crystals may be doped with the rare-earth elements. In some embodiments, the rare-earth element may include but is not limited to cerium (Ce), europium (Eu), neodymium (Nd), or the like. In some examples, the materials of the first phosphor layer 140 and the second phosphor layer 150 may be, $Y_3Al_5O_{12}$:Ce (Ce:YAG), $(Y,Gd)_3Al_5O_{12}$:Ce, $Lu_3Al_5O_{12}$:Ce (Ce:LuAG), $Tb_3Al_3O_{12}$:Ce, $Ca_3Sc_2Si_3O_{12}$:Ce, $Lu_2CaMg_2(Si,Ge)_3O_{12}$:Ce, $(Sr,Ba)_2SiO_4$:Eu, $Ca_3SiO_4Cl_2$:Eu, $Sr_3SiO_5$:Eu, $Li_2SrSiO_4$:Eu, $Ca_3Si_2O_7$:Eu, $CaAl_{12}O_{19}$:Mn, $SrAl_2O_4$:Eu, ZnS:Cu,Al, CaS:Eu, $CaGa_2S_4$:Eu, $SrGa_2S_4$:Eu, $CaSi_2O_2N_2$:Eu, $SrSi_2O_2N_2$:Eu, $BaSi_2O_2N_2$:Eu, Ca-α-SiAlON, $CaAlSiN_3$:Eu, $CaSi_5N_8$:Eu or the like. The phosphor material has satisfactory thermal conductivity, such that the property of heat dissipation of the light-emitting device can be improved.

In the present invention, white light or light having other chromaticity may be generated by combining the light-emitting unit 120 that emits blue light or other light having a short wavelength with the phosphor crystal material. Chromaticity of the white light may be adjusted by using different phosphor crystals. For example, to prevent the blue-enriched white light, the second phosphor layer 150 may be formed by a material that emits light having a longer wavelength after absorbing the light of the light-emitting unit 120.

The first phosphor layer 140 is formed by a phosphor crystal sheet. The second phosphor layer 150 is formed by plural phosphor crystal powders 151, and each of the phosphor crystal powders 151 has one or more crystal orientations. The phosphor crystal sheet and the phosphor crystal powders 151 respectively have a single crystal structure or a poly crystal structure. In some embodiments where the phosphor crystal sheet and the phosphor crystal powders respectively have a single crystal structure, the phosphor crystal sheet and the phosphor crystal powders 151 respectively have a doping concentration of the rare-earth element in a range from 0.1 at % to 6 at. %. In some embodiments where the phosphor crystal sheet and the phosphor crystal powders respectively have a poly crystal structure, the phosphor crystal sheet and the phosphor crystal powders 151 respectively have a doping concentration of the rare-earth element in a range from 0.1 at % to 15 at. %. Based on different formation method from that of the single-crystal phosphor, a higher doping concentration of the rare-earth element is achievable in a poly-crystal phosphor bar, and non-uniform doping concentration will not occur in such phosphor bar. Therefore, a wider range of the concentration of the rare-earth element may be applicable to form the poly-crystal phosphor bar. The higher concentration of the rare-earth element represents that light having a longer wavelength is emitted by the phosphor crystal sheet or the phosphor crystal powders after absorbing the light of the light-emitting unit 120, when the phosphor bar is applied to form such phosphor crystal sheet or phosphor crystal powders 151. A wider range of the concentration of the rare-earth element increases the flexibility of adjusting the chromaticity of the emission light. By a combination of the single crystal or the poly crystal having different doping concentration of the rare-earth element, the second phosphor layer 150 may be used as a compensation layer for adjusting the chromaticity of the light emitted from the first phosphor layer 140, so that the problem of the blue-enriched white light can be tackled. Alternatively, light having a desired chromaticity can be obtained by combing the light having different ranges of the wavelengths.

Some aspects of the composite structure of the first phosphor layer 140 and the second phosphor layer 150 are described as follows. However, the present invention is not limited to the following examples. In addition, the flowing examples are described with specific technical effects; while these effects can exist in other examples having different configuration.

In one example, the phosphor crystal sheet and the phosphor crystal powders are respectively formed by single-crystal Ce:YAG having the same Ce-doping concentration. For example, the Ce-doping concentration is 2 at. %. After absorbing the light of the light-emitting unit 120, the first phosphor layer 140 and the second phosphor layer 150 emit yellow light having a wavelength in a range from 514 nm to 546 nm. In this example, the second phosphor layer 150 increases the chance for the light of the light-emitting unit 120 being absorbed by the phosphor material, and the blue light that directly penetrates the phosphor layer is reduced. The composite structure of the single-crystal sheet and the single-crystal phosphor crystal powders tackles the problem of the blue-enriched white light.

In the other examples, the phosphor crystal sheet and the phosphor crystal powders are Ce:YAG having different Ce-doping concentrations, and both the phosphor crystal sheet and the phosphor crystal powders have a single-crystal structure. For example, the Ce-doping concentration of the phosphor crystal sheet is 0.68 at. %, and the emission light has a wavelength of 528 nm after absorbing the light of the light-emitting unit 120; the Ce-doping concentration of the phosphor crystal powders is 6 at. %, and the emission light has a wavelength of 540 nm after absorbing the light of the light-emitting unit 120. Because both the phosphor crystal sheet and the phosphor crystal powders have a single-crystal structure, less defects occurs. Such single-crystal structure has merits such as stable energy level transition and high light conversion rate, and thus the light-emitting device having such configuration has satisfactory light emission efficiency. In addition, the Ce-doping concentration of the single-crystal phosphor powders is greater than the Ce-doping concentration of the phosphor crystal sheet, leading to two kinds of light having different emission wavelengths and chromaticity, such that the chromaticity of the emission light of the light-emitting device can be adjusted.

In one example, the phosphor crystal sheet and the phosphor crystal powders are Ce:YAG having different Ce-doping concentrations, the phosphor crystal sheet has a single-crystal structure, and the phosphor crystal powders has a poly-crystal structure. For example, the Ce-doping concentration of the phosphor crystal sheet is o.68 at. %, and the emission light has a wavelength of 528 nm after absorbing the light of the light-emitting unit 120. The Ce-doping concentration of the phosphor crystal powders is 12 at. %, and the emission light has a wavelength of 550 nm after absorbing the light of the light-emitting unit 120. Compared to the single-crystal phosphor crystal powders, costs for manufacturing the poly-crystal phosphor crystal powders is low, and the applicable range of the Ce-doping concentration is wider, and thus the flexibility for adjusting the chromaticity of the emission light increases.

In further examples, the phosphor crystal sheet and the phosphor crystal powders are Ce:YAG having the same Ce-doping concentrations, and both the phosphor crystal sheet and the phosphor crystal powders have poly-crystal structures. For example, the respective Ce-doping concentrations of the phosphor crystal sheet and the phosphor crystal powders are 6 at. %, and the emission light has a wavelength of 540 nm after absorbing the light of the light-emitting unit 120. Costs for manufacturing the polycrystal phosphor are low, and the applicable range of the Ce-doping concentration is wider, and thus the flexibility for adjusting the chromaticity of the emission light increases. Alternatively, the phosphor crystal sheet and the phosphor crystal powders may have different Ce-doping concentrations.

In some embodiments, a ratio of a thickness of the first phosphor layer 140 to a thickness of the second phosphor layer 150 is 1:1 to 14:1. When the ratio is greater than the desired range, that is, the second phosphor layer 150 does not have sufficient thickness, the length of the light path is insufficient such that the light having a desired chromaticity cannot be obtained (e.g., the problem of the blue-enriched white light). On the other hand, when the ratio is smaller than the desired range, that is, the first phosphor layer 140 does not have sufficient thickness, the thick second phosphor layer 150 may cause the unsatisfactory light emission efficiency of the light-emitting device, because the light conversion rate of the phosphor crystal sheet is more satisfactory than the light conversion rate of the phosphor crystal powders. In one example, a total thickness of the first phosphor layer 140 and the second phosphor layer 150 is 150 µm to 200 µm. The total thickness is compatible with the present specification of the common light-emitting device, and thus the manufacturing costs can be reduced.

The light generated by the light-emitting device 100 may have any chromaticity. For example, in some examples, a combination of the blue light of the light-emitting unit 120 and the green light of the phosphor may be used as a light-emitting diode that emits green light. Alternatively, in the specific structure, fluorescent powders having other colors may be mixed with the phosphor crystal powders. For example, red fluorescent powders can be mixed with the phosphor crystal powders, such that red-shift occurs in the light of the light-emitting device. Alternatively, a fluorescent layer may be additionally formed on the second phosphor layer 150 of the phosphor crystal powders to adjust the chromaticity of the light generated by the light-emitting device.

In some embodiments, as shown in FIG. 1, the phosphor crystal powders 151 in the second phosphor layer 150 are sintered to be connected to each other, and the phosphor crystal powders 151 are in contact with the first phosphor layer 140, and also sintered to be connected to the first phosphor layer 140. That is, the light-emitting device 100 of the present invention does not arrange (or dispose) an adhesion agent layer to fix the phosphor crystal powders on 151 the first phosphor layer 150. When the phosphor crystal powders 151 are disposed and fixed on the first phosphor layer 140 by using the adhesive agent, the adhesive agent may cause a negative effect on the property of heat dissipation of the light-emitting device 100. Furthermore, a risk of pollution caused by using the adhesive agent may increase.

In some embodiments, an average particle size of the phosphor crystal powders 151 may be 10 µm to 20 µm. Besides, a difference of the particle sizes of the phosphor crystal powders 151 is preferable less than 50% of the average particle size. Using the phosphor crystal powders having such average particle size and such size difference is advantageous for forming the second phosphor layer 150 having a hard packed structure, thereby increasing the chance for the light of the light-emitting unit 120 being absorbed by the phosphor.

In the light-emitting device of the present invention, for example, 20% to 80% of the light of the light-emitting device having a short wavelength may be absorbed by the first phosphor layer 140 and the second phosphor layer 150. The light conversion rate of the absorbed light (e.g., the blue light) may be in a range from 85% to 95%, such that the light-emitting device 100 may have the light emission efficiency at least 150 lumens/watt.

Figure 2:
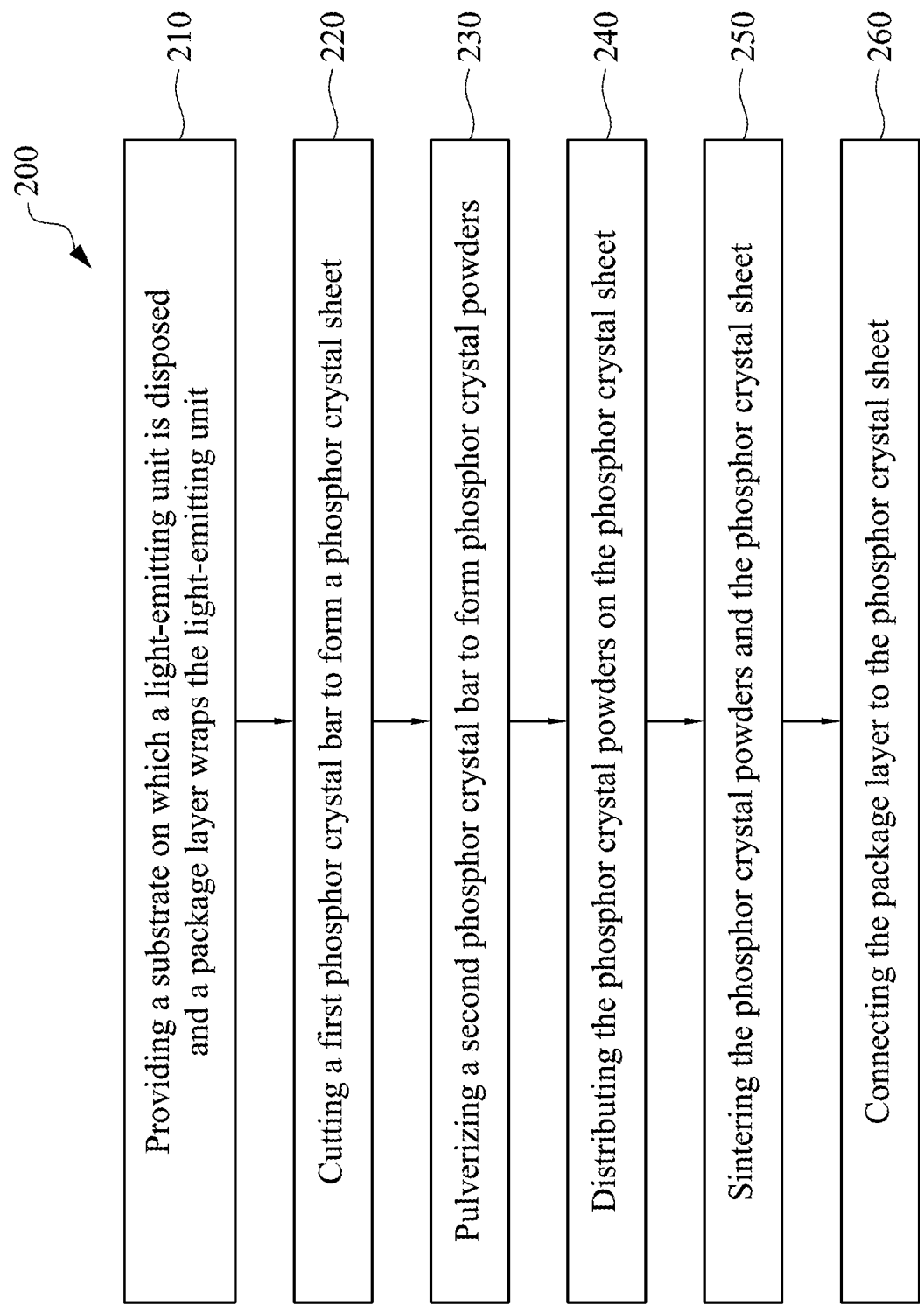
FIG. 2 is a flow chart for producing a light-emitting device in accordance with some embodiments showing the present invention.

The other aspect of the present invention provides a method of forming a light-emitting device. Please refer to FIG. 1 and FIG. 2. FIG. 2 is a schematic flow chart showing a method of forming a light-emitting device in accordance with some embodiments of the present invention. However, additional operations may be added before, during or after the illustrated operations, or some illustrated operations may be omitted or exchanged.

At operation 210 of a forming method 200, the substrate 110 of FIG. 1 is provided, and a light-emitting unit 120 and the package layer 130 are formed on the substrate 110. In some embodiments, the material of the package layer 130 may be coated onto the substrate 110, followed by patterning the material to form the opening 131, such that a portion of the substrate 110 is exposed from the opening 131. Then, the light-emitting unit 120 may be disposed in the opening 131.

Figure 3:
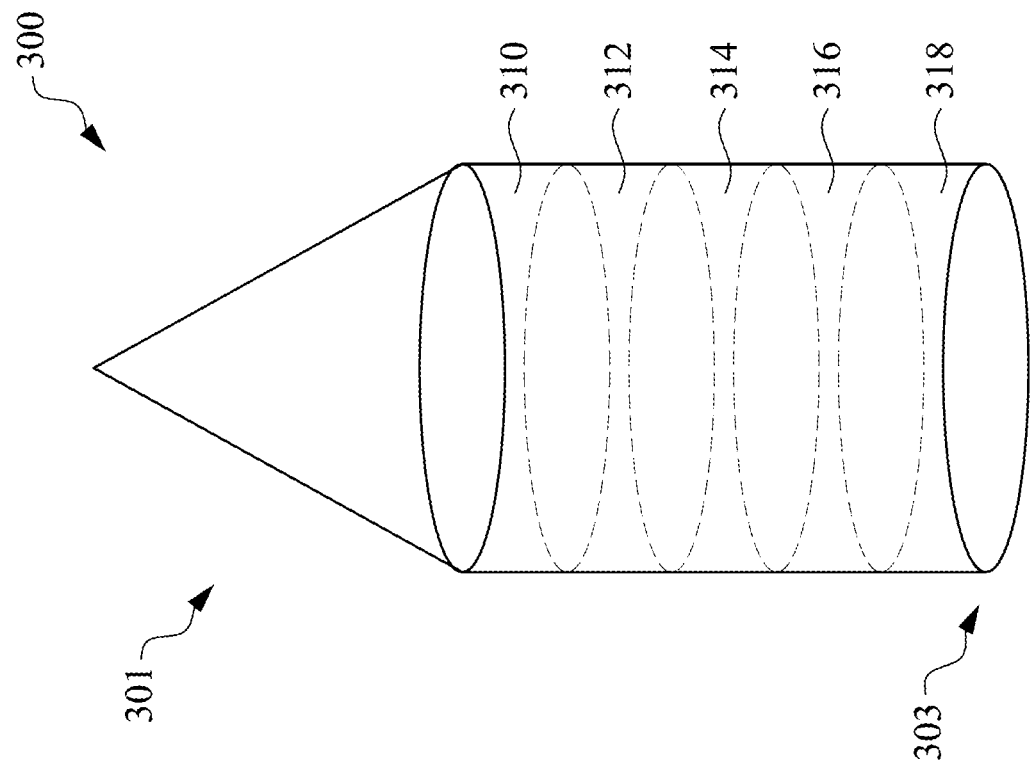
FIG. 3 is a schematic view showing a single-crystal phosphor crystal bar.

Next, as shown in operation 220, a phosphor crystal bar is cut to form a phosphor crystal sheet. In some embodiments of the operation 220, a phosphor crystal bar 300 having a single crystal structure may be formed by using epaxial growing methods such as Czochralski process or the like, as shown in FIG. 3. The phosphor crystal bar 300 has a head portion 301 and an end portion 303. The phosphor crystal bar 300 is doped with the rare-earth element and has the doping concentration in a range from 0.1 at. % to 0.6 at. %, and the concentration of the rare-earth element is uniformly distributed in the whole first phosphor crystal bar 300. In the phosphor crystal bar having the single crystal structure, when the concentration of the rare-earth element is greater than such range, the rare-earth element may be non-uniformly distributed. When the phosphor crystal having the non-uniformly distributed rare-earth element is used as the first phosphor layer 140, the emission light of the layer 140 formed by absorbing the light of the light-emitting unit 120 may have irregular wavelength, causing difficulty in compensating for the chromaticity of the phosphor layer. On the other hand, when the concentration of the rare-earth element is lower than the lower limit shown above, the light of the light-emitting unit 120 cannot be converted to the light having desired wavelength.

In the Czochralski crystal growth process, a necking process may be performed first by using a pull rate of 1-5 mm/hr to form a slender crystal with a diameter of 1-10 mm and a length of 3-50 mm. Then, the pull rate may decrease to 0.5-4 mm/hr to grow the shoulder of the crystal until the diameter of the crystal reach 20-75 mm. Afterwards, the pull rate may be adjusted to 0.3-3 mm/hr to grow the body of the crystal which has a well-control diameter. The process continues until the body of the crystal reach the expected length. In some examples, the crystal has a length of 5 cm to 20 cm.

In other embodiments of the operation 220, the phosphor crystal bar having the poly structure may be formed by a melting process or the like. The phosphor crystal bar having the poly structure may have the doping concentration of the rare-earth element of 0.1 at. % to 15 at. %, and the rare-earth element is uniformly distributed in the whole phosphor crystal bar. In the method of forming the phosphor crystal having the poly crystal structure, the doping concentration of the rare-earth element has a greater upper limit; however, when the doping concentration exceeds the upper limit, the rare-earth element may be quenched and defects may occur in the phosphor crystal. Similarly, when the doping concentration of the rare-earth element is lower than the lower limit, the light of the light-emitting device 120 cannot be converted into the light having the desired wavelength.

Generally, the phosphor crystal having the poly crystal structure has more defects such as oxygen vacancy. Therefore, an operation such as annealing may be performed on the crystal bar in the process of forming the crystal bar to reduce the oxygen vacancy.

Specifically, powder materials having a desired composition are mixed and added into a crucible, and the melting process is performed at a temperature of 1900° C. to 2000° C. For example, to produce the Ce YAG phosphor crystal having the poly crystal structure, yttrium oxide ($Y_2O_3$), aluminum oxide ($Al_2O_3$) and ceric oxide ($CeO_2$) may be added and melted. Next, the materials are cooled down and the poly crystal bar is formed. Then, the poly crystal bar is annealed at 1500° C. to 1800° C. to reduce the defects of the poly crystal bar, and then the phosphor crystal bar having the poly crystal structure is formed.

Afterwards, the phosphor crystal bar 300 having the single or poly crystal structure may be cut into the phosphor crystal sheets 310, 312, 314, 316 and 318 of FIG. 3, each of these sheets has a thickness in a range from 200 μm to 250 μm. FIG. 3 shows the single crystal bar, while the poly crystal bar may be cut using the similar method. For example, the phosphor crystal sheets 310, 312, 314, 316 and 318 may be cut by laser cutting or wire saw. A polishing process may be performed on the phosphor crystal sheets after the cut process, such that the phosphor crystal sheets may have the desired thickness and are used as the first phosphor layer 140. Alternatively, the phosphor crystal sheet having the poly crystal structure may be used as the first phosphor layer 140.

Then, as shown in operation 230, the phosphor crystal bar is pulverized to form the phosphor crystal powders. In some embodiments of the operation 230, similar to the operation 220, the phosphor crystal bar having the single crystal structure or the poly crystal structure may be formed by using epaxial growing method such as Czochralski process or the like, and the phosphor crystal bar has a structure similar to the phosphor crystal bar 300 of FIG. 3. In addition, similar to the other embodiments of the operation 220, the phosphor crystal bar having the poly crystal structure may be formed by using the melting process or the like. Details for the Czochralski process and the melting process are described as above and may not be repeated herein. Therefore, the concentration of the rare-earth element of the phosphor crystal bar is uniformly distributed. Next, common apparatus for pulverizing, such as ball milling machine, a hammer mill, a jet mill or the like, may be used to pulverize the phosphor crystal bar to form the phosphor crystal powders 151 of FIG. 1. The average particle size and the size difference of the crystal powders are described as above and may not be repeated herein.

The phosphor crystal powders may be used to form a compensation layer for the phosphor crystal sheet. For example, a chromaticity coordinate of the desired emission light of the light-emitting device is (x1, y1), and a chromaticity coordinate of the emission light generated by the phosphor crystal sheet which absorbs the light having a specific wavelength (e.g., the light of the light-emitting unit 120) is (x2, y2). According to these two coordinates, the doping concentration of the rare-earth element of the second phosphor crystal bar may be adjusted, such that the phosphor crystal powders may compensate for the chromaticity of the emission light of the phosphor crystal sheet.

Next, as shown in operation 240, plural phosphor crystal powders are distributed on the phosphor crystal sheet. In the embodiment of the operation 240, the particle size of the phosphor crystal powders 151 distributed on the phosphor crystal sheet 312 may be controlled by a sieve. The operation of distributing the phosphor crystal powders onto the phosphor crystal sheet indicates that the phosphor crystal powders remain in the powder state and directly contact the phosphor crystal sheet 312. Therefore, in some embodiments, an operation of distributing the phosphor crystal powders in the adhesion agent is excluded from the method of the present invention.

Then, as shown in operation 250, a sintering process is performed on the phosphor crystal powders and the phosphor crystal sheet, such that the phosphor crystal powders are sintered to be connected to each other, and sintered to be connected to the phosphor crystal sheet to form the composite structure of the phosphor crystal. In some embodiments, the sintering process is performed at a temperature in a range from 1600° C. to a temperature lower than a melting point of the phosphor crystal powders 151. In some examples, the sintering process may be performed at the temperature between 1600° C. and a temperature lower than 1900° C. for 1 day to 3 days. When the phosphor crystal powders 151 are sintered under such temperature for sufficient time, the phosphor crystal powders 151 can adhere to each other and can adhere to the phosphor crystal sheet 312 without using the adhesive agent. In some embodiments, the method of forming the light-emitting device further includes performing a planarizing process on the layer formed by the phosphor crystal powders 151 after the sintering process. Then, as shown in operation 260, the composite structure is connected to the package layer 130 to form the light-emitting device 100.

Figure 4:
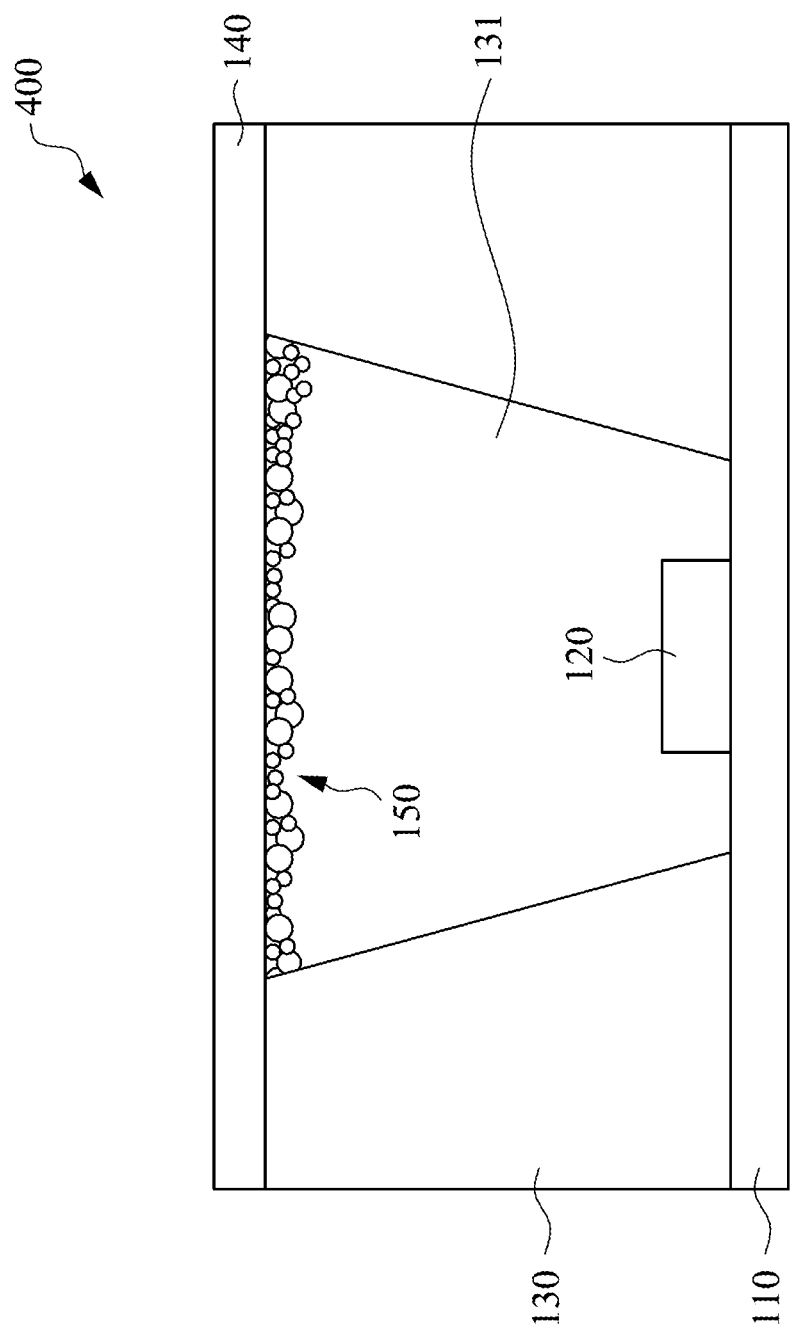
FIG. 4 through FIG. 8 are cross-sectional views showing light-emitting devices in accordance with some embodiments of the present invention.

Please refer to FIG. 4. FIG. 4 is a cross-sectional view showing a light-emitting device in accordance with other embodiments of the present invention. Elements in a light-emitting device 400 of FIG. 4 that are similar to those shown in the light-emitting device 100 of FIG. 1 are labelled with the same reference numbers of FIG. 1. Difference is that the second phosphor layer 150 is formed on a side of the first phosphor layer 140 that is relatively close to the light-emitting unit 120, compared to the other side of the first phosphor layer 140. In other words, in the embodiment of FIG. 4, the emission light of the light-emitting unit 120 contacts the second phosphor layer 150 and the first phosphor layer 140 in sequence. In the embodiment of FIG. 4, the second phosphor layer 150 is merely distributed (or disposed) on the position where the first phosphor layer 140 is in contact with (overlaps) the open 131. However, in other embodiments, the second phosphor layer 150 may be distributed (or disposed) on the other position. For example, the second phosphor layer 150 may be located between the package layer 130 and the first phosphor layer 140.

Figure 5:
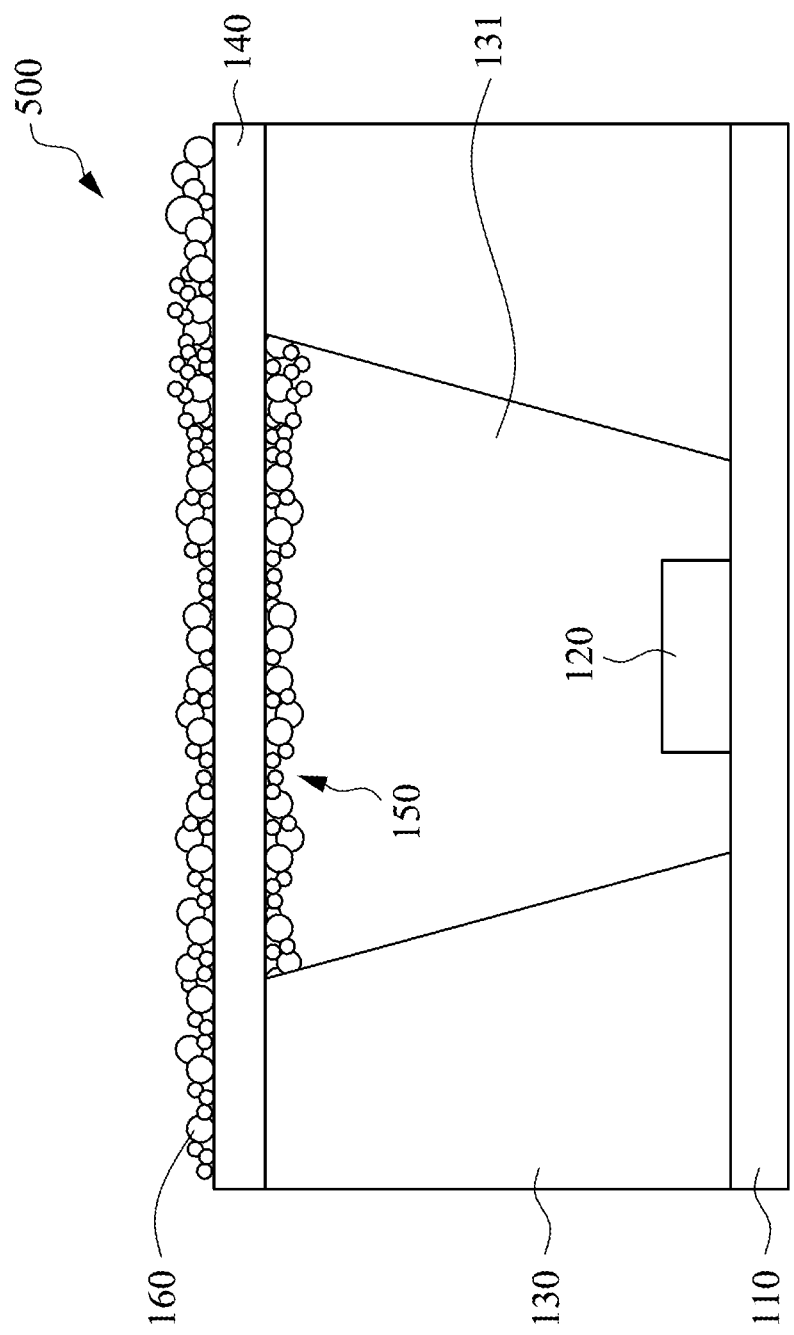

Please refer to FIG. 5. FIG. 5 is a cross-sectional view showing a light-emitting device in accordance with further embodiments of the present invention. Elements in a light-emitting device 500 of FIG. 5 that are similar to those shown in the light-emitting device 100 of FIG. 1 are labelled with the same reference numbers of FIG. 1. The second phosphor layer 150 and a third phosphor layer 160 are respectively disposed on two opposite surfaces of the first phosphor layer 140 of the light-emitting device 500. In some examples, the second phosphor layer 150 and the third phosphor layer 160 are formed by the same phosphor crystal powders. In the other examples, the second phosphor layer 150 and the third phosphor layer 160 are formed by different phosphor crystal powders, so that the emission light of the light-emitting unit 120 and the emission light of each phosphor layer may be mixed to obtain the light having the desired wavelength.

Figure 6:
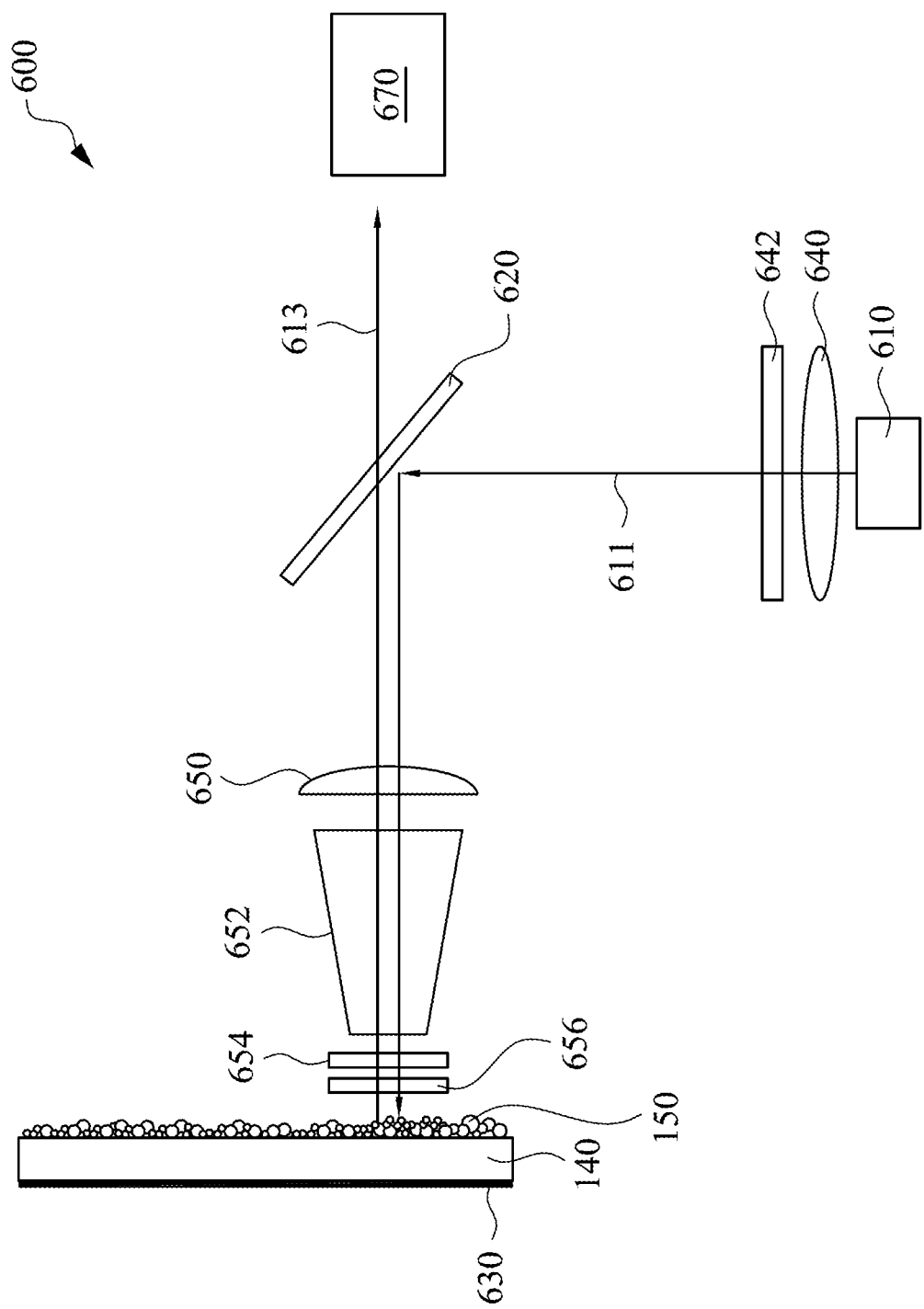

Please refer to FIG. 6. FIG. 6 is a cross-sectional view showing a light-emitting device in accordance with some embodiments of the present invention. A light-emitting device 600 of FIG. 6 may be, for example, a reflection-type laser projector. Elements in a light-emitting device 600 of FIG. 6 that are similar to those shown in the light-emitting device 100 of FIG. 1 are labelled with the same reference numbers of FIG. 1. The light-emitting device 600 at least includes a light source 610, a polarizing beam splitter 620, the composite structure of the first phosphor layer 140 and the second phosphor layer 150 and a reflecting layer 630. The second phosphor layer 150 is disposed on a first surface of the first phosphor layer 140, and the reflecting layer 630 is disposed on a second surface of the first phosphor layer 140 that is opposite to the first surface. A composite structure of the phosphor layer and the reflecting layer 630 may be used as a color wheel of the laser projector.

For example, the light source 610 may be a laser array, a layer diode or a light-emitting diode which is configured with a polarization splitter. The light source 610 may output polarized emitting light 611 having a proper wavelength. For example, the light source 610 may be a blue-light laser array that has polarized emitting light 611 having a wavelength of 400 nm to 495 nm. The polarization beam splitter 620 is configured to reflect the polarized light 611 of the light source 610 and introduce the light to the composite structure of the first phosphor layer 140 and the second phosphor layer 150. The reflecting layer 630 may be formed by a material such as silver, dichroic coating or a combination thereof. Phosphorescence 613 is emitted from the first phosphor layer 140 and the second phosphor layer 150 after the polarized emitting light 611 is absorbed by the first phosphor layer 140 and the second phosphor layer 150, and the phosphorescence 613 may be introduced into a chip module 670 of the laser projector by using the polarization beam splitter 620.

In some embodiments, the light-emitting device 600 may further include a condensing lens 640 disposed on the path of the polarized emitting light 611. In addition, a diffuser 642 may be also arranged in the light-emitting device 600, such that the polarized emitting light 611 travels through the diffuser 642 after polarized emitting light 611 travels through the condensing lens 640.

In other embodiments, an exit mirror 650, a light-guided element 652, a wavelength conversion dichroic unit 654 and a reflecting polarization-splitter 656 may be sequentially configured on the path that the polarized emitting light 611 passes through after being reflected. The exit mirror 650 is configured to convert the emitted phosphorescence 613 into telecentric bundles. The light-guided element 652 is configured to receive the polarized emitting light 611 and guide the polarized emitting light 611 toward the first phosphor layer 140 and the second phosphor layer 150. The wavelength conversion dichroic unit 654 is configured to reflect a portion of the light having a shorter wavelength that is emitted by the phosphor layer, in which the portion of the light may be introduced to the first phosphor layer 140 and the second phosphor layer 150, such that the portion of the light can be absorbed and emitted again by the first phosphor layer 140 and the second phosphor layer 150. The portion of the light having the shorter wavelength may be converted to the light having the proper wavelength (e.g., the phosphorescence 613) after a few cycles. The reflecting polarization-splitter 656 may reflect the polarized emitting light that is orthogonal to the polarized emitting light 611.

It is noted that the phosphor crystal material has satisfactory thermal conductivity. Therefore, when the phosphor crystal material is applied to the light-emitting device which heat is easily generated, the property of the heat dissipation of the light-emitting device can be improved. In some examples, a heat-dissipating layer (not shown) may be further disposed on the composite structure of the first phosphor layer 140, the second phosphor layer 150 and the reflecting layer 630. For example, the heat dissipating layer is disposed on the reflecting layer 630.

Figure 7:
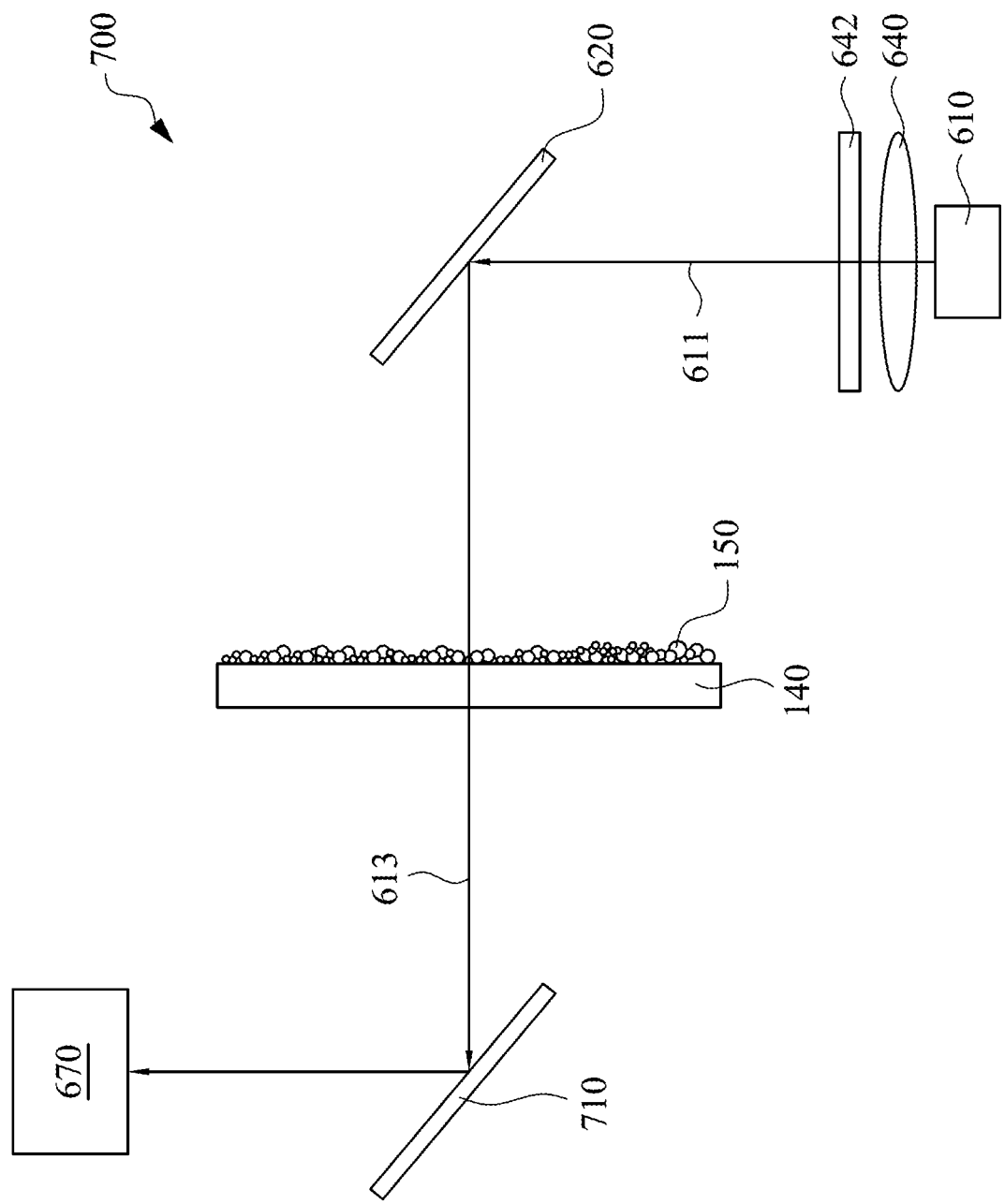

Please refer to FIG. 7. FIG. 7 is a cross-sectional view showing a transmission laser projector in accordance with some embodiments of the present invention. Elements in a light-emitting device 700 of FIG. 7 that are similar to those shown in the light-emitting device 100 of FIG. 1 are labelled with the same reference numbers of FIG. 1. A reflecting layer is not configured in the composite structure of the first phosphor layer 140 and the second phosphor layer 150 of the light-emitting device 700, so that a portion of the polarized emitting-light 611 may travel through the first phosphor layer 140 and the second phosphor layer 150, and the other portion of the light is absorbed by the first phosphor layer 140 and the second phosphor layer 150, followed by emitting the phosphorescence 613. As shown in the embodiments of FIG. 7, the polarized emitting light 611 travels through the second phosphor layer 150 and the first phosphor layer 140 in sequence. However, in other embodiments, similar to the configuration of the light-emitting device 100 FIG. 1, the polarized emitting light 611 travels through the first phosphor layer 140 first, and then travels through the second phosphor layer 150. The generated phosphorescence 613 may be introduced into the chip module 670 of the laser projected by a splitter 710.

Figure 8:
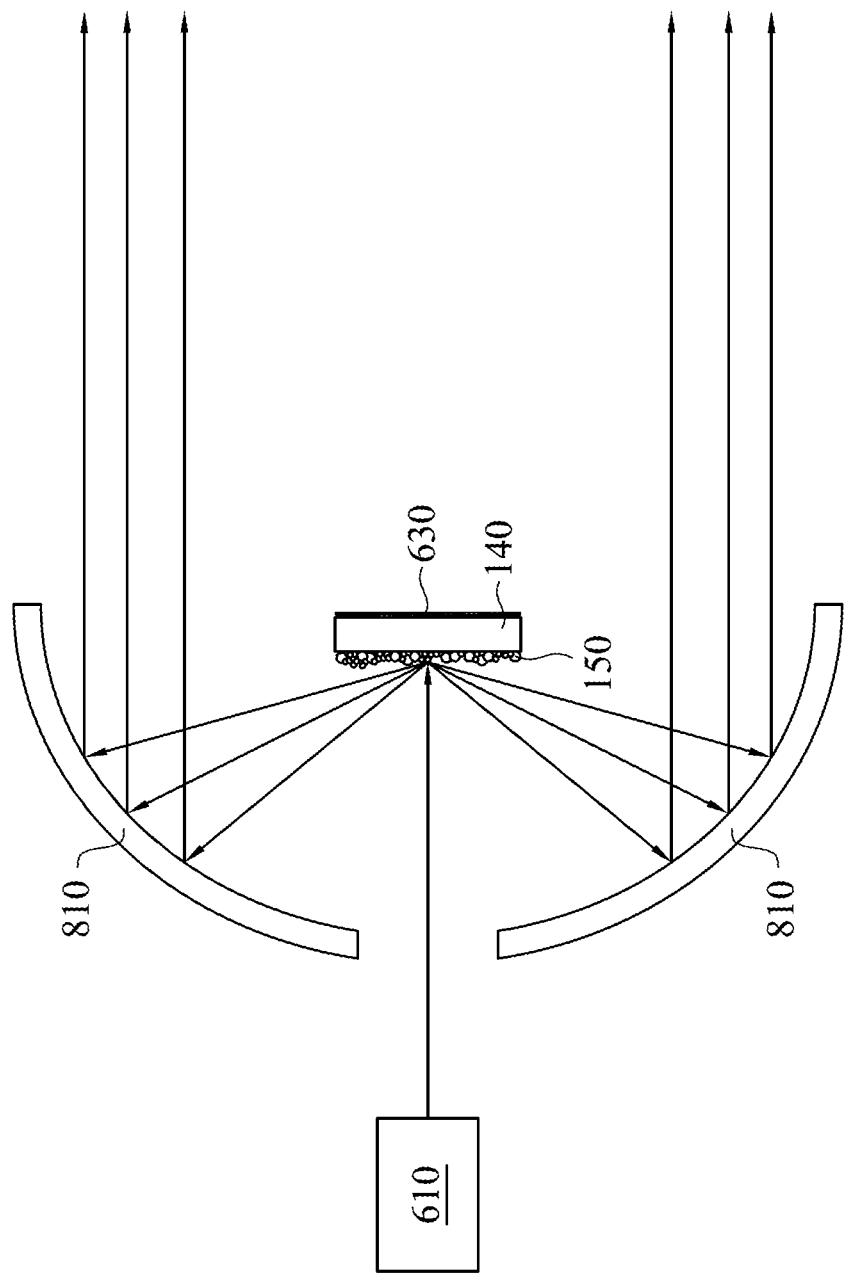

Please refer to FIG. 8. FIG. 8 is a cross-sectional view showing a light-emitting device in accordance with some embodiments of the present invention. A light emitting device 800 of FIG. 8 may be a car headlight. The light-emitting device 800 may include the light source 610, the composite structure of the first phosphor layer 140, the second phosphor layer 150 and the reflecting layer 630, and a reflection element 810. The reflection element 810 is disposed between the composite layer and the light source 610, such that the light emitted or reflected by the composite structure may be reflected by the reflection element 810.

Several examples are shown in the present invention, however, the scope of the present invention is not limited to these examples. The composite structure of the phosphor layers in the present invention may be applied to common light-emitting devices, and the configuration may be modified depending on the requirements.

In the light-emitting device and the method of forming thereof, the composite structure of the phosphor crystal sheet and the phosphor crystal powders is applied without using the adhesive agent to tackle the problem of the blue-enriched white light. Furthermore, the composite structure is compatible with the specification of the common light-emitting devices and the chromaticity of the emitting light may be easily adjusted. In addition, the light-emitting device has satisfactory property of the heat dissipation, light conversion rate and light emission efficiency.

Although the present invention has been described in considerable detail with reference to certain embodiments thereof, other embodiments are possible. It will be apparent to those skilled in the art that various modifications and variations can be made to the structure of the present invention without departing from the scope or spirit of the invention. Therefore, the spirit and scope of the appended claims should not be limited to the description of the embodiments contained herein.

What is claimed is:

1. A light-emitting device, comprising:
    a first phosphor layer composed of a phosphor crystal sheet, wherein the first phosphor layer has a first surface and a second surface opposite to the first surface;
    a second phosphor layer disposed on the second surface of the first phosphor layer, wherein the second phosphor layer is composed of a plurality of first phosphor crystal powders, each of the first phosphor crystal powders has a crystal orientation, and the first phosphor crystal powders are sintered to be connected to each other, and at least a portion of the first phosphor crystal powders is sintered to be connected to the second surface of the first phosphor layer; and
    a light source disposed near a side of the first surface of the first phosphor layer, or near a side of the second phosphor layer.

2. The light-emitting device of claim 1, wherein the phosphor crystal sheet has a single crystal structure or a poly crystal structure, and the first phosphor crystal powders have a single crystal structure or a poly crystal structure.

3. The light-emitting device of claim 1, further comprising a third phosphor layer disposed on the first surface of the first phosphor layer, wherein the third phosphor layer is composed of a plurality of second phosphor crystal powders, and each of the second phosphor crystal powders has a crystal orientation.

4. The light-emitting device of claim 2, wherein the first phosphor crystal powders having the poly crystal structure is doped with a rare-earth element, and a doping concentration of the rare-earth element is at least 0.1 at %.

5. The light-emitting device of claim 4, wherein a first emitting light of the light source has a first light-emitting wavelength, the first phosphor layer absorbs the first emitting light and emits a second emitting light having a second light-emitting wavelength, and the second phosphor layer absorbs the first emitting light and emits a third emitting light having a third light-emitting wavelength, and wherein the second light-emitting wavelength is smaller than or equal to the third light-emitting wavelength.

6. The light-emitting device of claim 2, wherein the phosphor crystal sheet having the single crystal structure is doped with a rare-earth element, and the rare-earth element has a doping concentration equal to or smaller than 6 at. %.

7. The light-emitting device of claim 1, wherein a ratio of a thickness of the first phosphor layer to a thickness of the second phosphor layer is in a range from 1:1 to 14:1.

8. The light-emitting device of claim 1, wherein the light source is disposed on the side of the second phosphor layer, and the light-emitting device further comprises a reflecting layer disposed on the first surface of the first phosphor layer.

9. The light-emitting device of claim 1, wherein the light source is disposed on the side of the second phosphor layer, and the light-emitting device further comprises a reflecting unit disposed between the second phosphor layer and the light source.

10. The light-emitting device of claim 1, further comprising:
    a substrate, wherein the light source is disposed on the substrate; and
    a package layer wrapping around the light-source and disposed on the substrate, wherein the first phosphor layer is disposed on the package layer via the first surface.

* * * * *